United States Patent
Lou

(10) Patent No.: US 11,804,417 B2
(45) Date of Patent: Oct. 31, 2023

(54) SEMICONDUCTOR STRUCTURE COMPRISING HEAT DISSIPATION MEMBER

(71) Applicant: TECAT TECHNOLOGIES (SUZHOU) LIMITED, Suzhou (CN)

(72) Inventor: Choon Leong Lou, Singapore (SG)

(73) Assignee: TECAT TECHNOLOGIES (SUZHOU) LIMITED, Suzhou (CN)

( * ) Notice: Subject to any disclaimer, the term of this patent is extended or adjusted under 35 U.S.C. 154(b) by 380 days.

(21) Appl. No.: 17/171,581

(22) Filed: Feb. 9, 2021

(65) Prior Publication Data

US 2022/0199488 A1 Jun. 23, 2022

(30) Foreign Application Priority Data

Dec. 23, 2020 (CN) .......................... 202023141504.5

(51) Int. Cl.
H01L 23/373 (2006.01)
H01L 23/00 (2006.01)
H01L 23/367 (2006.01)

(52) U.S. Cl.
CPC ...... H01L 23/3733 (2013.01); H01L 23/3677 (2013.01); H01L 24/29 (2013.01); *H01L 2224/29393* (2013.01)

(58) Field of Classification Search
CPC . H01L 23/3733; H01L 24/29; H01L 23/3677; H01L 2224/29393; H01L 23/373; H01L 23/00; H01L 23/367; H01L 23/42
USPC ........................................................ 257/712
See application file for complete search history.

(56) References Cited

U.S. PATENT DOCUMENTS

| | | | |
|---|---|---|---|
| 7,375,417 B2 * | 5/2008 | Tran .................... | H01L 23/4952 257/E23.033 |
| 10,836,633 B2 | 11/2020 | Inoue et al. | |
| 2005/0061496 A1 | 3/2005 | Matabayas | |
| 2007/0134599 A1 * | 6/2007 | Raravikar ............... | C01B 32/16 257/E23.09 |
| 2009/0072408 A1 * | 3/2009 | Kabir ..................... | B32B 37/06 257/773 |

(Continued)

FOREIGN PATENT DOCUMENTS

JP 2010118609 A * 5/2010 ........... H01L 23/373
TW I241005 B 10/2005

(Continued)

OTHER PUBLICATIONS

Preiiminary office action dated Dec. 11, 2020 from CNIPIA for counterpart apptication CN202023141504.5.

(Continued)

*Primary Examiner* — William C Trapanese
(74) *Attorney, Agent, or Firm* — Muncy, Geissler, Olds & Lowe, P.C.

(57) ABSTRACT

A semiconductor structure includes a die including a circuitry disposed over a surface of the die or within the die and having specific functions for the die; a heat dissipation member attached to the die by an adhesive disposed between the surface of the die and the heat dissipation member; and a nanostructure disposed between the adhesive and the die, configured to conduct heat from the die to the heat dissipation member, protruding from the adhesive towards the surface of the die and contacting the surface of the die.

10 Claims, 2 Drawing Sheets

(56) References Cited

U.S. PATENT DOCUMENTS

| | | | |
|---|---|---|---|
| 2013/0154074 A1 | 6/2013 | Oh | |
| 2014/0085829 A1* | 3/2014 | Yamashita | ............ H01L 23/142 |
| | | | 361/717 |
| 2017/0342550 A1* | 11/2017 | Siegal | .................... C23C 16/26 |
| 2019/0010376 A1 | 1/2019 | Inoue et al. | |
| 2019/0304934 A1* | 10/2019 | Kamphuis | ........... H01L 23/5227 |

FOREIGN PATENT DOCUMENTS

| | | | | |
|---|---|---|---|---|
| TW | 201324730 A1 | 6/2013 | | |
| TW | 201722845 A | 7/2017 | | |
| TW | 201736255 A | 10/2017 | | |
| WO | 2016141217 A | 9/2016 | | |
| WO | 2019203178 A1 * | 10/2019 | ............. | H01L 23/42 |

OTHER PUBLICATIONS

Office Action dated Dec. 11, 2020 in Chinese application No. CN202023141504.5 w/English translation.

Office Action dated May 4, 2021 in TW Application No. 110101448, 5 pages.

* cited by examiner

SEMICONDUCTOR STRUCTURE COMPRISING HEAT DISSIPATION MEMBER

TECHNICAL FIELD

The present disclosure relates to a semiconductor structure, and particularly relates to a semiconductor structure including an adhesive and a nanostructure for attaching a heat dissipation member over a die or a package. Further, the present disclosure relates to a semiconductor structure comprising the adhesive and the nanostructure.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices performing different functions are integrated and packaged into a single module. The semiconductor device in a such high density integration may generate a large amount of heat during use. The heat may gradually affect the operation of the semiconductor device, or even ultimately damage the semiconductor structure.

Accordingly, there is a continuous need to improve thermal management in the structure and during the manufacturing of semiconductor devices.

This Discussion of the Background section is provided for background information only. The statements in this Discussion of the Background are not an admission that the subject matter disclosed in this Discussion of the Background section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure. The semiconductor structure includes a die including a circuitry disposed upon or within the die and having specific functions for the die; a heat dissipation member attached to the die by an adhesive disposed between a surface of the die and the heat dissipation member; and a nanostructure disposed between the adhesive and the die, configured to conduct heat from the die to the heat dissipation member, protruding from the adhesive towards the surface of the die and contacting the surface of the die.

In some embodiments, the surface of the die is configured with the circuitry.

In some embodiments, the die is configured with another surface opposite to the surface, the another surface of the die is not configured with the circuitry, the heat dissipation member is attached to the die by the adhesive disposed between the heat dissipation member and the another surface of the die, and the nanostructure is disposed between the adhesive and the die.

In some embodiments, the nanostructure includes graphene or carbon.

In some embodiments, the nanostructure is in a tubular shape.

In some embodiments, the nanostructure includes a carbon nanotube (CNT).

In some embodiments, the nanostructure is elongated between the adhesive and the surface of the die.

In some embodiments, the nanostructure protrudes from the adhesive toward the surface of the die.

In some embodiments, the adhesive and the nanostructure are attachable to and detachable from the surface of the die.

In some embodiments, the nanostructure is thermally conductive.

In some embodiments, the nanostructure is substantially perpendicular to the surface of the die and the heat dissipation member.

In some embodiments, the nanostructure is integral with the adhesive.

In some embodiments, the nanostructure has an aspect ratio substantially greater than 1000:1.

In some embodiments, the nanostructure is transparent or opaque to visible light.

Another aspect of the present disclosure provides a semiconductor structure. The semiconductor structure includes a die, an adhesive and a nanostructure; the adhesive and the nanostructure are disposed over a surface of the die; and a heat dissipation member is disposed over the adhesive and the nanostructure, wherein the nanostructure is disposed between the surface of the die and the adhesive.

In some embodiments, the disposing of the heat dissipation member includes attaching the heat dissipation member to the surface of the die by the adhesive and the nanostructure.

In some embodiments, the nanostructure is disposed on the adhesive or the surface of the die by deposition.

In some embodiments, the nanostructure is formed by chemical vapor deposition (CVD) or laser operation.

In some embodiments, the heat dissipation member is removed from the adhesive, or the heat dissipation member, the adhesive and the nanostructure are removed from the die.

In some embodiments, the heat dissipation member is attached to the adhesive, or the heat dissipation member is attached to the die by the adhesive and the nanostructure.

In some embodiments, the adhesive and the nanostructure are heated upon the disposing of the heat dissipation member.

In some embodiments, the heat dissipation member is pressed toward the adhesive, the nanostructure and the die.

In the present disclosure, the nanostructure is disposed between the heat dissipation member and the die. Since the nanostructure is thermally conductive, the heat dissipated from the die during operation can be effectively conducted from the die to the heat dissipation member through the nanostructure. In addition, the nanostructure can increase the contact area between the heat dissipation member and the die, and allows separation and reattachment of the adhesive.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

Figure 1:
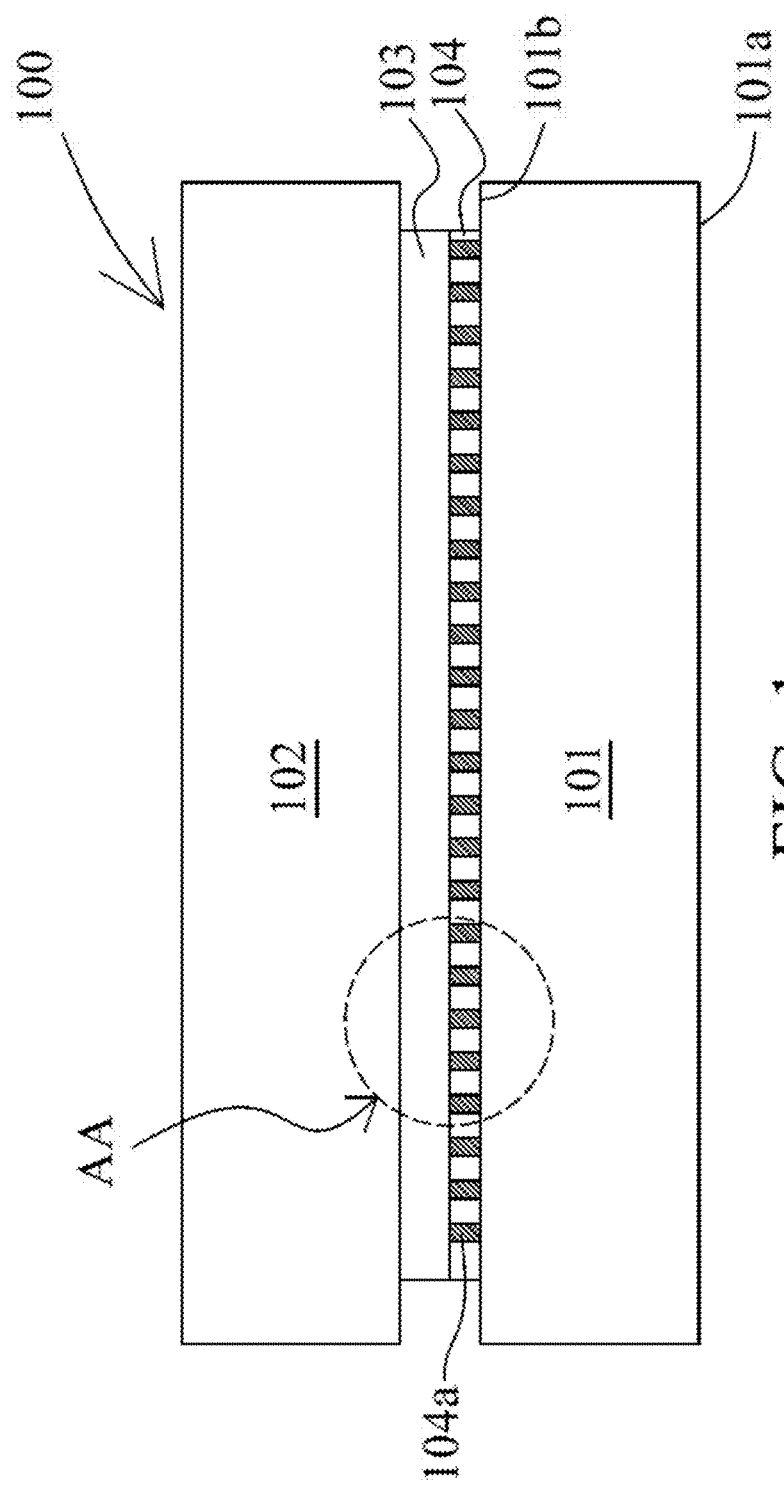
FIG. 1 is a schematic cross-sectional view of a semiconductor structure in accordance with some embodiments of the present disclosure.

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

In order to make the present disclosure completely comprehensible, detailed steps and structures are provided in the following description. Obviously, implementation of the present disclosure does not limit special details known by persons skilled in the art. In addition, known structures and steps are not described in detail, so as not to unnecessarily limit the present disclosure. Preferred embodiments of the present disclosure will be described below in detail. However, in addition to the detailed description, the present disclosure may also be widely implemented in other embodiments. The scope of the present disclosure is not limited to the detailed description, and is defined by the claims.

In the present disclosure, a semiconductor structure is disclosed. The semiconductor structure includes a die including a circuitry disposed upon a surface of the die or within the die and having specific functions for the die; a heat dissipation member attached to the die by an adhesive disposed between the surface of the die and the heat dissipation member; and a nanostructure disposed between the adhesive and the die. The die has another surface opposite to the surface. The heat dissipation member can also attach to the die by the adhesive disposed between the another surface of the die and the heat dissipation member. The nanostructure is disposed between the adhesive and the die. Since the nanostructure is thermally conductive, the heat dissipated from the die during operation can be effectively conducted from the die toward the heat dissipation member through the nanostructure.

Further, the nanostructure can increase attachment area between the heat dissipation member and the die. In other words, the heat dissipation member can be securely attached to the die. The strength of the attachment between the heat dissipation member and the die can be increased. Furthermore, the presence of the nanostructure between the heat dissipation member and the die allows detachment and reattachment of the adhesive. As such, the adhesive is reusable if there is a need to detach the heat dissipation member from the die. Therefore, a structural configuration of the semiconductor structure and a versatility of a manufacturing process of the semiconductor structure can both be improved.

Figure 2:
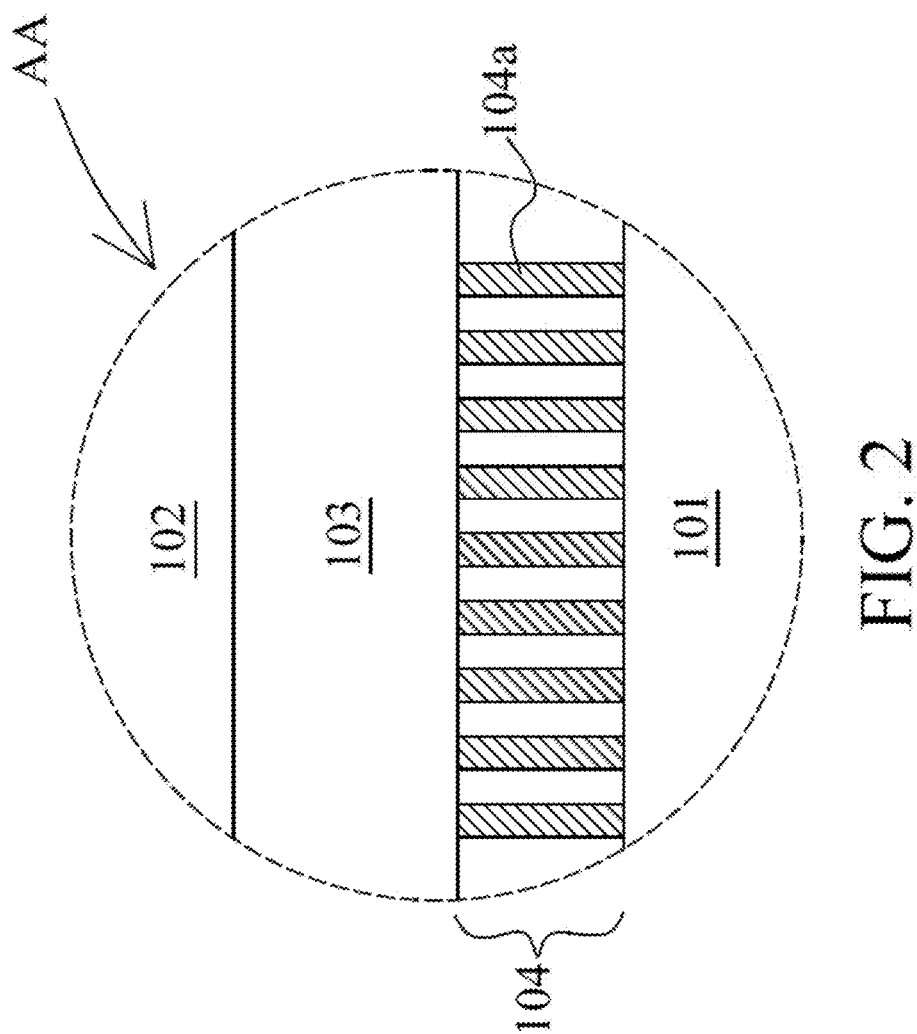
FIG. 2 is an enlarged view of a portion AA of the semiconductor structure in FIG. 1.

FIG. 1 is a schematic cross-sectional view of a semiconductor structure 100 in accordance with some embodiments of the present disclosure, and FIG. 2 is an enlarged view of a portion AA in the semiconductor structure 100 of FIG. 1. In some embodiments, the semiconductor structure 100 includes a die 101, a heat dissipation member 102, an adhesive 103 and a nanostructure 104.

In some embodiments, the die 101 includes a circuitry disposed upon or within the die 101. In some embodiments, the die 101 is fabricated with a predetermined functional circuit within the die 101 produced by photolithography operations. In some embodiments, the die 101 includes several conductive traces and several electrical components such as a transistor, a diode, etc. connected by the conductive traces and disposed within the die 101.

In some embodiments, the die 101 includes semiconductive material such as silicon, germanium, gallium, arsenic, or combinations thereof. In some embodiments, the die 101 is singulated from a semiconductive wafer by a mechanical blade or a laser blade.

In some embodiments, the die 101 comprises a variety of electrical circuits suitable for a particular application. In some embodiments, the die 101 comprises of any one of various known types of semiconductor devices such as memories, microprocessors, application-specific integrated circuits (ASICs) or the like.

In some embodiments, the die 101 includes a first surface 101a and a second surface 101b opposite to the first surface 101a. In some embodiments, the first surface 101a is a front side or an active side on which several electrical components are disposed. In some embodiments, the second surface 101b is a back side or an inactive side from which electrical components are absent. In some embodiments, a cross section of the die 101 has a quadrilateral, rectangular, square, polygonal or any other suitable shape.

In some embodiments, the heat dissipation member 102 is disposed over the die 101. In some embodiments, the heat dissipation member 102 is disposed over the second surface 101b of the die 101. In some embodiments, the heat dissipation member 102 is configured to direct heat to the surroundings. In some embodiments, the heat dissipation member 102 is a lid, a heat sink, a heat spreader or the like. In some embodiments, the heat dissipation member 102 includes metals or thermally-conductive materials such as aluminum, copper or the like.

In some embodiments, the adhesive 103 and the nanostructure 104 are disposed between the heat dissipation member 102 and the die 101. In some embodiments, the heat dissipation member 102 is attached to the die 101 by the adhesive 103 disposed between the second surface 101b of the die 101 and the heat dissipation member 102. In some embodiments, the adhesive 103 includes epoxy, glue, polymer or the like.

In some embodiments, the nanostructure 104 is formed on the adhesive 103. In some embodiments, the nanostructure 104 is disposed between the adhesive 103 and the die 101. In some embodiments, the adhesive 103 is integral with the nanostructure 104. In some embodiments, the nanostructure 104 is evenly distributed over the adhesive 103. In some embodiments, the adhesive 103 and the nanostructure 104 are substantially coplanar with the second surface 101b of the die 101.

In some embodiments, the adhesive 103 is attached to the heat dissipation member 102, and the nanostructure 104 is attached to the second surface 101b of the die 101. In some embodiments, the nanostructure 104 is configured to conduct heat from the die 101 to the heat dissipation member 102. In some embodiments, the nanostructure 104 includes graphene or carbon. In some embodiments, the nanostructure 104 is thermally conductive. In some embodiments, a thermal conductivity of the nanostructure 104 is substantially greater than 400 W/m/K. In some embodiments, the nanostructure 104 is transparent or opaque to visible light.

In some embodiments, the nanostructure 104 is elongated between the adhesive 103 and the second surface 101b of the die 101. In some embodiments, the nanostructure 104 protrudes from the adhesive 103 toward the second surface 101b of the die 101. In some embodiments, the nanostructure 104 is substantially perpendicular to the second surface 101b of the die 101 and the heat dissipation member 102. In some embodiments, the nanostructure 104 has an aspect ratio substantially greater than 1000:1.

In some embodiments, the nanostructure 104 includes a carbon nanotube (CNT). In some embodiments, as illustrated in FIG. 2, the nanostructure 104 includes several nanotubes 104a protruding from the adhesive 103. In some embodiments, the nanotubes 104a are CNT or include graphene. In some embodiments, the nanotube 104a has a tubular or cylindrical shape. In some embodiments, the nanotube 104a is substantially perpendicular to the second surface 101b of the die 101. In some embodiments, the nanotube 104a has an aspect ratio substantially greater than 1000:1.

In some embodiments, the heat dissipation member 102 is attached to the die 101 by the adhesive 103 and the nanostructure 104. In some embodiments, the adhesive 103 and the nanostructure 104 are attachable to and detachable from the second surface 101b of the die 101. In other words, the adhesive 103 and the nanostructure 104 can be peeled off from the die 101 when the adhesive 103 and the nanostructure 104 are attached to the die 101. In some embodiments, since the nanostructure 104 includes several nanotubes 104a in contact with the second surface 101b of the die 101, an adhesion between the heat dissipation member 102 and the die 101 by the adhesive 103 can be increased or improved. Therefore, the heat dissipation member 102 can be securely attached to the die 101, and can be detached from the die 101 upon application of a force for peeling off the adhesive 103 and the nanostructure 104 from the die 101 and the heat dissipation member 102.

In some embodiments, heat generated from the die 101 can be conducted to the heat dissipation member 102 through the nanostructure 104. In some embodiments, the die 101 is in contact with the nanotubes 104a, and therefore the heat from the die 101 can be conducted to the heat dissipation member 102 through the nanotubes 104a. Since the nanostructure 104 is thermally conductive, the heat from the die 101 can be effectively conducted from the die 101 toward the heat dissipation member 102 through the nanostructure 104.

Although the present disclosure and its advantages have been described in detail, it should be understood that various changes, substitutions and alterations can be made herein without departing from the spirit and scope of the disclosure as defined by the appended claims. For example, many of the processes discussed above can be implemented through different methods, replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A semiconductor structure comprising:
    a die including a circuitry disposed upon a surface of the die or within the die and having specific functions for the die;
    a heat dissipation member attached to the die by an adhesive disposed between the surface of the die and the heat dissipation member; and
    a nanostructure disposed between the adhesive and the die, configured to conduct heat from the die to the heat dissipation member, protruding from the adhesive towards the surface of the die and contacting the surface of the die;
    wherein the nanostructure is integral with the adhesive, and the adhesive and the nanostructure are attachable to and detachable from the surface of the die.

2. The semiconductor structure of claim 1, wherein the nanostructure includes graphene or carbon.

3. The semiconductor structure of claim 1, wherein the nanostructure is in a tubular shape.

4. The semiconductor structure of claim 1, wherein the nanostructure includes a carbon nanotube (CNT).

5. The semiconductor structure of claim 1, wherein the nanostructure is elongated between the adhesive and the surface of the die.

6. The semiconductor structure of claim 1, wherein the nanostructure is thermally conductive.

7. The semiconductor structure of claim 1, wherein the nanostructure is substantially perpendicular to the surface of the die and the heat dissipation member.

8. The semiconductor structure of claim 1, wherein the nanostructure has an aspect ratio substantially greater than 1000:1.

9. The semiconductor structure of claim 1, wherein the nanostructure is transparent or opaque to visible light.

10. The semiconductor structure of claim 1, wherein the die includes another surface opposite to the surface, the heat dissipation member is attached to the die by the adhesive disposed between the another surface of the die and the heat dissipation member, and the nanostructure is disposed between the adhesive and the die and configured to conduct heat from the die to the heat dissipation member.

* * * * *